United States Patent
Kanamori et al.

(10) Patent No.: US 9,292,428 B2
(45) Date of Patent: Mar. 22, 2016

(54) MEMORY SYSTEM

(71) Applicant: Kabushiki Kaisha Toshiba, Tokyo (JP)

(72) Inventors: Yuki Kanamori, Urayasu (JP); Yusuke Miyake, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 179 days.

(21) Appl. No.: 13/755,133

(22) Filed: Jan. 31, 2013

(65) Prior Publication Data

US 2014/0068149 A1   Mar. 6, 2014

Related U.S. Application Data

(60) Provisional application No. 61/697,107, filed on Sep. 5, 2012.

(51) Int. Cl.

| G11C 7/10 | (2006.01) |
|---|---|
| G06F 12/02 | (2006.01) |
| G06F 7/58 | (2006.01) |
| G11C 16/34 | (2006.01) |
| G11C 11/56 | (2006.01) |

(52) U.S. Cl.
CPC .............. *G06F 12/0246* (2013.01); *G06F 7/58* (2013.01); *G11C 7/1006* (2013.01); *G11C 16/3495* (2013.01); *G11C 11/5628* (2013.01)

(58) Field of Classification Search
None
See application file for complete search history.

(56) References Cited

U.S. PATENT DOCUMENTS

| 5,406,529 | A | 4/1995 | Asano | |
|---|---|---|---|---|
| 7,468,926 | B2 | 12/2008 | Shappir et al. | |
| 2006/0181934 | A1* | 8/2006 | Shappir et al. | 365/185.33 |
| 2008/0205145 | A1* | 8/2008 | Kanno et al. | 365/185.05 |
| 2009/0067244 | A1* | 3/2009 | Li et al. | 365/185.12 |
| 2009/0259803 | A1* | 10/2009 | Oh et al. | 711/103 |
| 2009/0316490 | A1 | 12/2009 | Takada | |
| 2010/0002504 | A1* | 1/2010 | Kim et al. | 365/185.03 |
| 2010/0235715 | A1* | 9/2010 | Thatcher et al. | 714/763 |
| 2010/0287427 | A1* | 11/2010 | Kim et al. | 714/721 |
| 2011/0222352 | A1* | 9/2011 | Aritome | 365/185.18 |
| 2012/0117306 | A1* | 5/2012 | Ahmed et al. | 711/103 |
| 2013/0077399 | A1* | 3/2013 | Kang | 365/185.2 |
| 2013/0139003 | A1* | 5/2013 | Patwardhan et al. | 714/32 |
| 2013/0279252 | A1* | 10/2013 | Fernandes | 365/185.03 |

FOREIGN PATENT DOCUMENTS

| JP | 6-111588 | 4/1994 |
|---|---|---|
| JP | 2006-228407 | 8/2006 |
| JP | 2008-198299 | 8/2008 |
| JP | 2010-503142 | 1/2010 |

* cited by examiner

*Primary Examiner* — Adam M Queler
*Assistant Examiner* — Dustin Bone
(74) *Attorney, Agent, or Firm* — Oblon, McClelland, Maier & Neustadt, L.L.P.

(57) ABSTRACT

According to one embodiment, a memory system includes a nonvolatile semiconductor storage device, a first storage module, a second storage module, a controller, a random number generator, and a randomizing module. The first storage module stores a plurality of management data. The second storage module stores seed data. The controller issues a first command to designate one of the management data, and issues a second command to command writing in or reading from the storage device. The random number generator generates random number data, by shuffling the seed data, based on the management data that is designated by the first command. The randomizing module randomizes written data or read data, based on the random number data.

14 Claims, 7 Drawing Sheets

F.I.G. 1

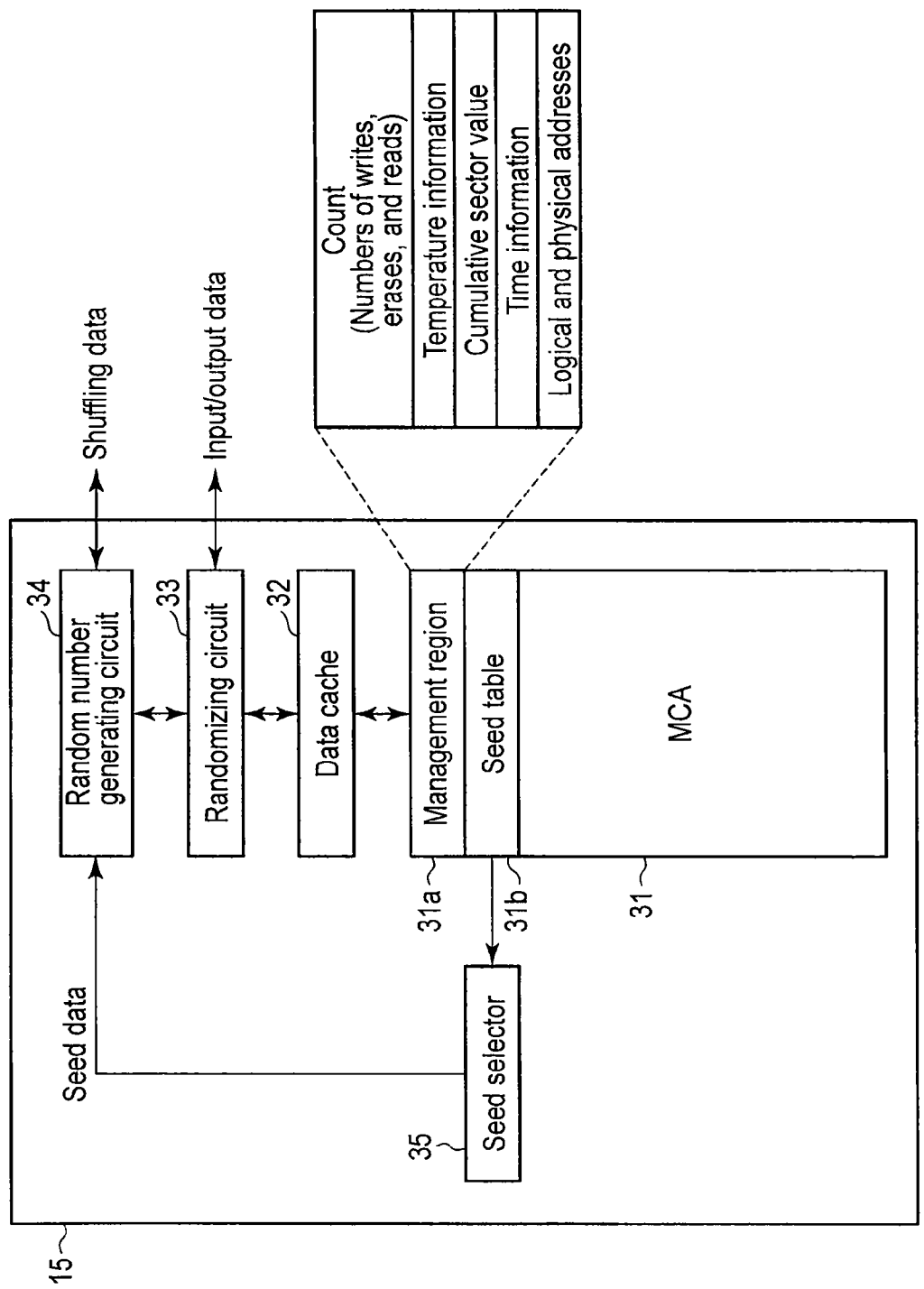
F I G. 2

(Number of erases: even)

|  | I/O 0 | I/O 1 | I/O 2 | I/O 3 |
|---|---|---|---|---|
| Lower | 0 | 1 | 0 | 1 |
| Upper | 0 | 0 | 1 | 1 |

FIG. 9A (Number of erases: odd)

|  | I/O 0 | I/O 1 | I/O 2 | I/O 3 |
|---|---|---|---|---|
| Lower | 1 | 0 | 1 | 0 |
| Upper | 0 | 0 | 1 | 1 |

FIG. 9B (Number of erases: even)

|  | I/O 0 | I/O 1 | I/O 2 | I/O 3 |
|---|---|---|---|---|
| Lower | 1 | 0 | 1 | 0 |
| Upper | 1 | 1 | 0 | 0 |

FIG. 9C (Number of erases: odd)

|  | I/O 0 | I/O 1 | I/O 2 | I/O 3 |
|---|---|---|---|---|
| Lower | 0 | 1 | 0 | 1 |
| Upper | 1 | 1 | 0 | 0 |

FIG. 9D

MEMORY SYSTEM

CROSS-REFERENCE TO RELATED APPLICATIONS

This application claims the benefit of U.S. Provisional Application No. 61/697,107, filed Sep. 5, 2012, the entire contents of which are incorporated herein by reference.

FIELD

Embodiments described herein relate generally to a memory system which is applied to, for example, a solid-state drive (SSD).

BACKGROUND

In non-volatile semiconductor memory device, such as NAND flash memory, a plurality of memory cells which are connected in series form a memory cell unit, and the memory cell unit is connected between a bit line and a source line. A memory cell array is formed of a plurality of memory cell units. In each memory cell unit, data is written in memory cells in order from, for example, a memory cell which is closer to a source line.

In recent years, multi-level memories, in which a plurality of bits can be stored in a memory cell, have been developed. In multi-level memories, one of a plurality of threshold voltages is stored in a memory cell, and a distribution width of each threshold voltage is set narrower than binary memories. Therefore, when data is written in adjacent memory cells in a multi-level memory, the threshold voltage of a memory cell in which data has been written earlier than the adjacent memory cells is changed. This is the problem which multi-level memories have. In particular, when write data have regular bias, change in the threshold voltage increases.

Therefore, to avoid regular bias of write data, the write data is randomized in, for example, an external controller.

BRIEF DESCRIPTION OF THE DRAWINGS

FIG. 2 is a block diagram of an example of a NAND flash memory which is illustrated in FIG. 1.

FIG. 9A, FIG. 9B, FIG. 9C, and FIG. 9D are diagrams for explaining operation of a third embodiment.

DETAILED DESCRIPTION

Figure 1:
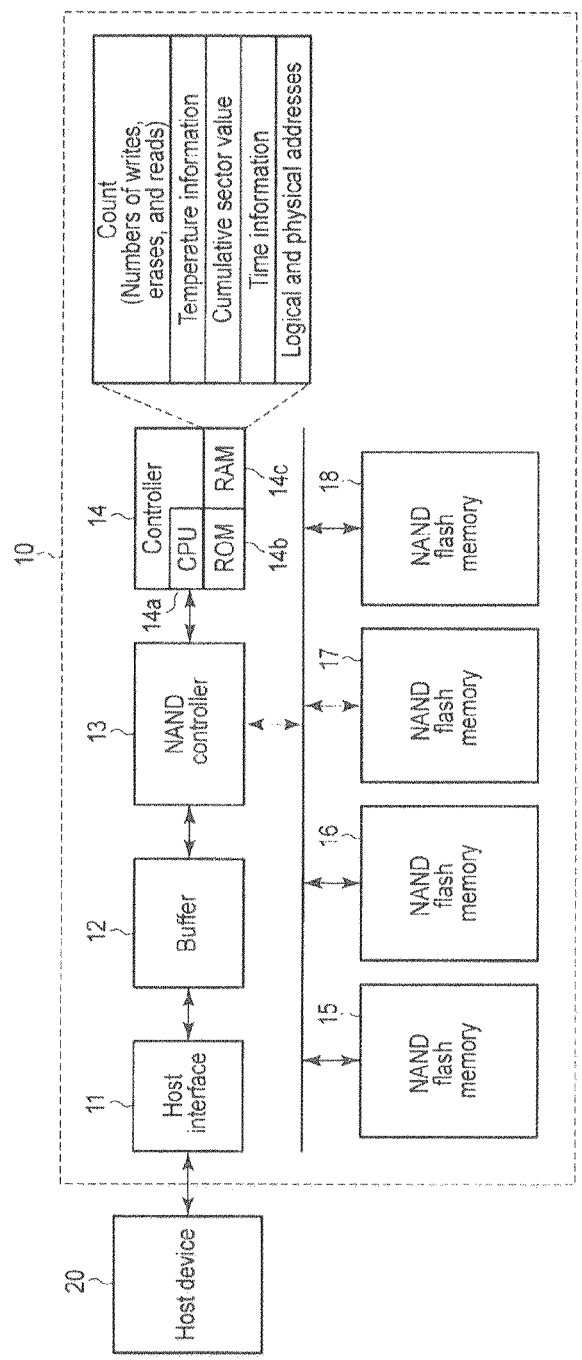
FIG. 1 is a block diagram of an example of, for example, an SSD which is applied to the present embodiment.

In general, according to one embodiment, a memory system includes a nonvolatile semiconductor storage device, a first storage module, a second storage module, a controller, a random number generating module, and a randomizing module. The first storage module stores a plurality of management data for managing writing or reading of the nonvolatile semiconductor storage device. The second storage module stores seed data for generating random number data. The controller issues a first command to designate one of the management data stored in the first storage module, and issues a second command to command writing in or reading from the nonvolatile semiconductor storage device. The random number generating module generates random number data, by shuffling the seed data which is supplied from the second storage module, based on the management data that is designated by the first command issued from the controller. The randomizing module randomizes written data or read data, based on the random number data which is generated by the random number generator.

NAND flash memories have disadvantages such as coupling noise, array ground line (AGL), and back pattern dependence (BPD), since a plurality of memory cells are connected in series between a bit line and a source line.

The coupling noise is mainly caused by capacitive coupling between bit lines, and the voltage of the selected bit is changed with lapse of time.

AGL means that the threshold voltage of a memory cell in which data has been written is changed, in a state where data is written in order in memory cell units in an erased state, due to influence of interconnect resistance of a source line, that is, a ground terminal, since a plurality of selected memory cells operate simultaneously, in a plurality of memory cell units including a plurality of memory cells which are connected in series, when data is written. In this case, the current of the source line decreases, and thus the threshold voltage of the memory cell increases.

In addition, when data is written in memory cells, the memory cell unit is in an erased state, and data is generally written in memory cells in order from a memory cell located close to the source line. In this case, the threshold voltage of the memory cell, in which data has been written, is changed according to data of a memory cell in which data is written later than the memory cell, specifically, the threshold voltage of the memory cell. Therefore, the written data is changed, and the threshold voltage in reading is changed. This phenomenon is called BPD.

Among them, in BPD, change in the threshold voltage becomes largest when there is regular bias in the written data, for example, almost all the bits of the block data have a value 1, that is, the threshold voltage of the written memory cell is high. As described above, in the case of a memory device which has the problem of BPD, most of data in 1 page of read data becomes errors, and the error correction circuit cannot completely correct the errors. Such regular data frequently occurs when digital sound or image data is stored. In addition, BPD causes a disadvantage that change in the threshold voltage increases as the number of cells which form a memory string increases in a NAND flash memory.

The coupling noise and AGL can be reduced to a level which does not cause any problem, by optimizing the structure of the operation timing of the memory cell array in the NAND flash memory, or reducing the interconnect resistance of the aluminum interconnects which form the source lines.

In comparison with this, when data includes regular bias, there are almost no effective measures against BPD at present, except reducing the current of the sense amplifier. When the current of the sense amplifier is reduced, however, the sensing time increases, and the problem of deterioration in signal-to-noise ratio occurs.

To solve the above problem, reduction in data errors is attempted by adding a pseudorandom number string to the input data outside the NAND flash memory.

The method of adding a pseudorandom number string outside the NAND flash memory causes, however, increase in the cost in design of the memory card controller. Therefore, it is required to incorporate a simple pseudorandom number generating circuit in the NAND flash memory.

When the pseudorandom number string has a uniform pattern in a specific block, however, the write level for each cell is biased, and a cell which is easily deteriorated is generated.

Specifically, pseudorandom numbers which are generated by using simple physical information, such as a page address, as seeds are generally used inside the NAND flash memory. Therefore, there is the problem that the pseudorandom number string has a uniform data pattern in a specific block, and a cell which is easily deteriorated is generated.

Therefore, it is required to improve the data randomizing performance in NAND flash memories.

(First Embodiment)

FIG. 1 is an example of, for example, an SSD to which a first embodiment is applied. The present embodiment is not limited to SSDs, however, but is applicable to, for example, an SD card.

In FIG. 1, an SSD 10 comprises a host interface 11, a buffer 12, a NAND controller 13, a controller 14, and a plurality of NAND flash memories 15 to 18. The number of NAND flash memories is not limited to 4, but can be changed according to the necessary storage capacity.

The host interface 11 is formed of, for example, a Serial ATA (SATA) interface, and controls interface with a host device 20. Specifically, the host interface 11 receives commands, data, and addresses which are supplied from the host device 20. The host interface 11 also transmits data and status signals which are read from the NAND flash memories 15 to 18 to the host device 20.

The host device 20 is, for example, a television set or a personal computer, but is not limited to them.

The host interface 11 is connected to the NAND controller 13 through the buffer 12.

The buffer 12 holds commands, data, and addresses which are to be supplied to the NAND controller 13 between the host interface 11 and the NAND controller 13, and holds data and status signals which are supplied from the NAND controller 13.

The controller 14 controls the whole SSD 10. The controller 14 includes, for example, a CPU 14a, a ROM 14b, and a RAM 14c.

The ROM 14b stores, for example, an initial program loader (IPL).

When the SSD 10 is started, the CPU 14a reads a control program, firmware such as a request processing module which processes requests (commands) from the host device 20, and management data from one of the NAND flash memories 15 to 18 by the IPL, and stores them in the RAM 14c.

The RAM 14c is used as a work area for various operations, and stores various firmware and management data. The management data are read from management regions of the NAND flash memories 15 to 18. Specifically, the RAM 14c holds management data which are read from the NAND flash memories 15 to 18. The management data includes counts such as the numbers of writes, erases, and reads on the NAND flash memory, the temperature information, a cumulative sector value which indicates the number of sectors, the time information, and a logical address and a physical address of the NAND flash memory. The management data is not limited to them, however, but may be information which is peculiar to the NAND flash memory. The management data held in the RAM 14c are updated by the controller 14, with access to the NAND flash memories 15 to 18.

The NAND controller 13 issues a command to access the NAND flash memories 15 to 18, in accordance with an access command to access the NAND flash memories 15 to 18, which is supplied from the controller 14 based on a request from the host device 20.

When the access command is a command to write data, the NAND controller 13 issues a command to write data which is supplied from the host device 20 in a designated address, for the NAND flash memories 15 to 18.

When the access command is a command to read data, the NAND controller 13 issues a command to read data from a designated address of the NAND flash memories 15 to 18, and transmits the data which is read from the NAND flash memories 15 to 18 to the buffer 12.

The NAND flash memories 15 to 18 have the same structure.

FIG. 2 illustrates an example of the structure of the NAND flash memory 15.

The NAND flash memory 15 includes, for example, a memory cell array (MCA) 31, a data cache 32, a randomizing circuit 33, a random number generating circuit 34, and a seed selector 35.

The memory cell array 31 includes, for example, a management region 31a serving as a first storage region, and a seed table 31b serving as a second storage region. The memory cell array 31 includes a plurality of blocks serving as erasing units, and each block is formed of a plurality of pages.

Each memory cell can store data of 1 bit or a plurality of bits. When each memory cell stores data of 1 bit, data of 1 page is stored in a plurality of memory cells which are selected by a word line. When each memory cell stores data of 2 bits or more, data of 2 pages or more is stored in a plurality of memory cells which are selected by a word line.

The management region 31a stores the management data described above. Specifically, when the power of the SSD 10 is turned off, the management data of the NAND flash memory 15 which is stored in the RAM 14c of the controller 14 is stored in the management region 31a.

The seed table 31b stores seed data for generating random numbers. The seed data is data for generating random numbers for, for example, each page, and has a desired pattern. The seed table 31b stores a plurality of seed data of different patterns for each page.

The seed data stored in the seed table 31b is selected by the seed selector 35, and supplied to the random number generating circuit 34. The seed selector 35 is controlled by a sequencer (not shown) of the NAND flash memories 15 to 18, and selects predetermined seed data.

The random number generating circuit 34 generates random number data based on seed data and shuffling data, when data is written. Specifically, the random number generating circuit 34 generates random number data by shuffling the seed data with the shuffling data.

The term "shuffling" in the embodiment means changing data, mixing data, disarranging a uniform system, rearranging data, and moving data. The shuffling data is data for changing the seed data. The shuffling data will be explained later.

The random number generating circuit 34 is formed of a plurality of exclusive-OR gates, and generates random number data by performing exclusive-OR operation for the seed data and the shuffling data. Although the random number generating circuit 34 performing exclusive-OR operation for the seed data and the shuffling data, the operation is not limited to exclusive-OR, but it is possible to use another logical operation.

The randomizing circuit 33 randomizes the write data, based on the random number data generated by the random number generating circuit 34.

The write data is data which is written in the NAND flash memory by a write command described later, and supplied from the host device 20. The term "randomizing" means disarranging regularity of data and signals. Specifically, randomizing includes changing the order of data and signals, changing arrangement of data and signals, changing data to a disorder (irregular) state, and moving data.

The output data of the randomizing circuit 33 is held in the data cache 32. The data which is held in the data cache 32 is written in the memory cell array 31.

Figure 3:
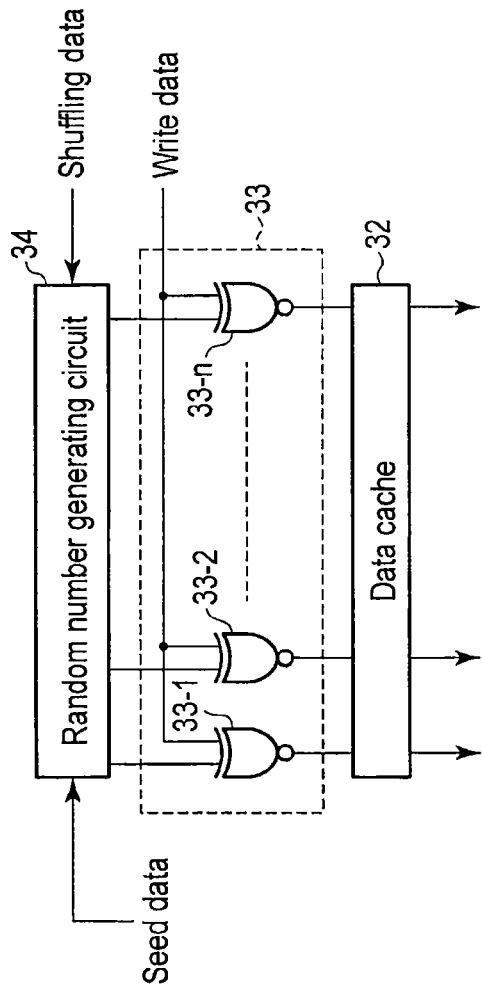
FIG. 3 is a block diagram which specifically illustrates a part of FIG. 2.

FIG. 3 illustrates an example of the randomizing circuit 33. The randomizing circuit 33 includes, for example, a plurality of exclusive-OR gates 33-1, 33-2, ..., and 33-n. In each of the exclusive-OR gates 33-1, 33-2, ..., 33-n, the random number data which is output from the random number generating circuit 34 is supplied to one input end, and write data is supplied to the other input end. Each output end of the exclusive-OR gates 33-1, 33-2, ..., and 33-n is connected to the data cache 32, and the write data which are randomized by the exclusive-OR gates 33-1, 33-2, ..., and 33-n are supplied to the data cache 32.

Figure 4:
FIG. 4 is a diagram for explaining operation of the first embodiment, and illustrating an example of a command sequence in writing.

FIG. 4 illustrates an example of a command sequence in write operation of the first embodiment.

In the first embodiment, when a write request is issued from the host device 20, the controller 14 uses, for example, the number of erases of the NAND flash memories 15 to 18, which is stored in the controller 14 as parameters (shuffling data), and issues a write request to the NAND controller 13. The shuffling data is preferably a value which changes when the same block is accessed again, such as the number of erases. The NAND controller 13 executes a command sequence which can shuffle the seed data, in response to the write request.

Specifically, as illustrated in FIG. 4, the NAND controller 13 adds a command (xxh) which sets parameters as the shuffling data, to a part before or after the write (program) command (80h) (h indicates a hexadecimal number). Thereafter, column addresses CA0 to CA11, and page addresses PA0 to PA19 are added. The parameters, commands, addresses and write data (not shown) which are issued by such a command sequence are transmitted to the NAND flash memories 15 to 18.

For example, when the NAND flash memory 15 receives the above write command (xxh), the random number generating circuit 34 illustrated in FIG. 3 shuffles the seed data by the parameters (the number of erases) serving as the shuffling data, and generates random number data. The random number data and the write data are supplied to the randomizing circuit 33. The randomizing circuit 33 randomizes the write data by the random number data. The output data of the randomizing circuit 33 is written in the memory cell array 31 through the data cache 32.

Figure 5:
FIG. 5 is a diagram for explaining operation of the first embodiment, and illustrating an example of a command sequence in reading.

On the other hand, FIG. 5 illustrates an example of a command sequence in data reading.

When a read request is issued from the host device 20, the controller 14 uses, for example, the number of erases of the NAND flash memories 15 to 18 stored in the controller 14 as parameters (shuffling data), and issues a read request to the NAND controller 13. The NAND controller 13 executes a command sequence which can shuffle the seed data, in response to the read request.

Specifically, as illustrated in FIG. 5, the NAND controller 13 adds a command (xxh) which sets parameters as the shuffling data, to a part before or after the read command (00h). Thereafter, column addresses CA0 to CA11, and page addresses PA0 to PA19 are added. The parameters, commands, addresses and write data (not shown) which are issued by such a command sequence are transmitted to the NAND flash memories 15 to 18.

In the command in reading, the same number of erases as that of the write sequence is used as the shuffling data, and data is recovered by using the random number data which is generated by shuffling the same seed data.

Figure 6:
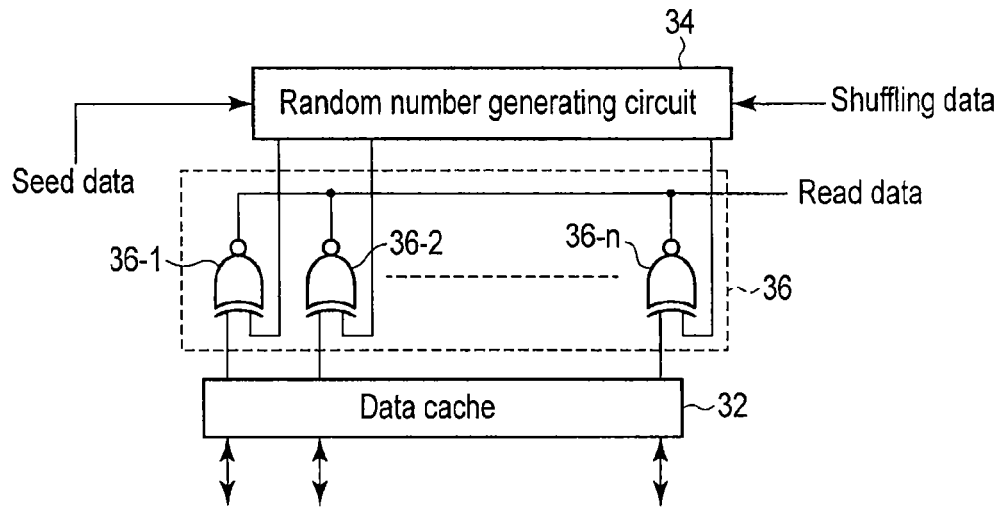
FIG. 6 is a diagram illustrating a modification of FIG. 3.

FIG. 6 illustrates an example of a recovery circuit 36 which is applied in reading. The same constituent elements as those of the FIG. 3 are denoted by the same reference numbers.

The recovery circuit 36 is formed of a plurality of exclusive-OR gates 36-1, 36-2, ..., 36-n. One input end of each of the exclusive-OR gates 36-1, 36-2, ..., 36-n is supplied with the output data of the data cache 32, and the other input end is supplied with the output data of the random number generating circuit 34. Recovered read data is output from the output end of each of the exclusive-OR gates 36-1, 36-2, ..., 36-n.

For example, when the NAND flash memory 15 receives a command (xxh) which sets the above parameters, the random number generating circuit 34 illustrated in FIG. 6 shuffles the seed data by using the parameters (the number of erases) serving as the shuffling data, and generates random number data. The random number data is read from the memory cell array 31, and supplied to the recovery circuit 36 together with the read data which is held in the data cache 32. The recovery circuit 36 recovers the read data by the random number data. The output data of the recovery circuit 36 is transmitted to the host device 20 through the NAND controller 13, the buffer 12, and the host interface 11.

According to the first embodiment, a command (xxh) which sets parameters for shuffling the seed data is added to the command sequence which is supplied to the NAND flash memories 15 to 18. When data writing is performed, the seed data is shuffled by the shuffling data which is designated by the parameters, and thereby random number data is generated. The write data is randomized by the random number data. Therefore, by shuffling the seed data by using the shuffling data, it is possible to generate random number data which has high random property. Therefore, even when the write data is biased to 0 or 1, it is possible to surely randomize the write data by using the on-chip randomizing circuit 33 mounted to the NAND flash memories, and improve the randomizing performance.

In addition, by improving the randomizing performance, it is possible to suppress occurrence of errors, prevent deterioration of the memory cells, and increase the life of the NAND flash memories.

Besides, by randomizing the data in the NAND flash memories, it is possible to reduce the number of times of I/O switching in comparison with the case of randomizing the data outside the NAND flash memories, and reduce the current consumption of the controller 14.

In addition, when data is read, random number data is generated by using the seed data and the shuffling data similar to those in writing, and the read data is recovered by using the random number data. Thereby, it is possible to securely recover the data.

(Second Embodiment)

In the above first embodiment, the seed selector 35 selects seed data based on control by a sequencer (not shown).

In comparison with this, according to a second embodiment, operation of the seed selector 35 is controlled by a command.

In the second embodiment, a seed table 31*b* stores a plurality of seed data. The seed data are set to seed values which equalize an average threshold level of each cell when, for example, the same block is repeatedly used. Therefore, no shuffling data is required in a random number generating circuit 34, and fixed data such as all "0s" and all "1s" is supplied to a shuffling data input end of the random number generating circuit 34.

Figure 7:
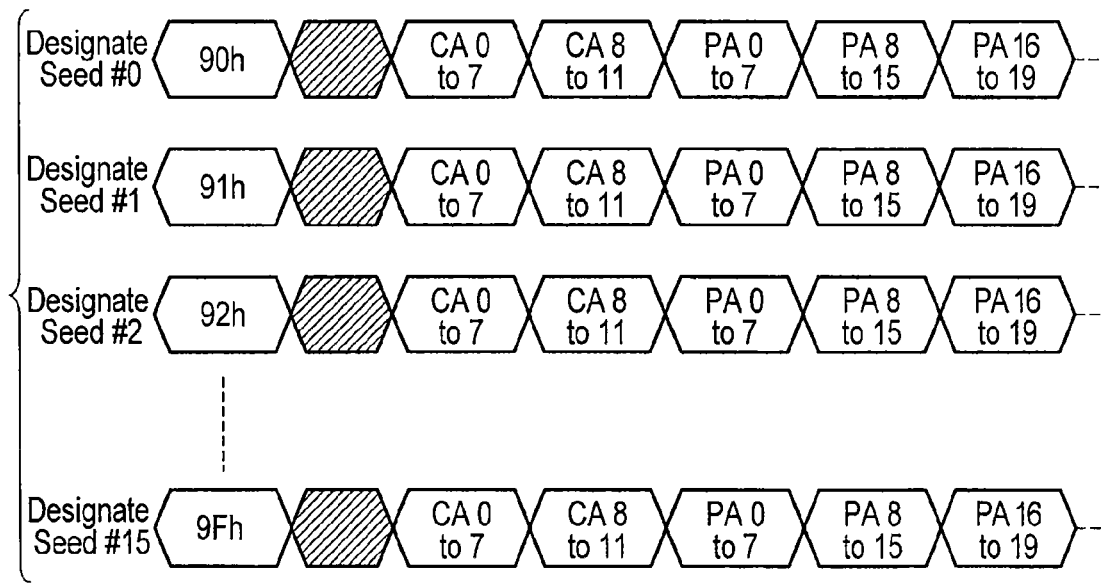
FIG. 7 is a diagram for explaining operation of a second embodiment, and illustrating an example of a command sequence in writing.

FIG. 7 illustrates an example of a command sequence in writing according to the second embodiment.

The program sequence includes commands (90h, 91h, 92h to 9Fh) to input seed numbers (Seed #0 to Seed #15) which designate a plurality of seed data of the seed table 31*b*. The commands (90h, 91h, 92h to 9Fh) indicate designation of seed numbers and data writing, and column addresses, page addresses, and write data (not shown) are input after the commands (90h, 91h, 92h to 9Fh).

For example, when a write request is issued from a host device 20, a controller 14 issues a write request to the NAND controller 13. The NAND controller 13 issues a command to designate one of the seed numbers (Seed #0 to Seed #15), in response to the write request.

When the above command is issued in the NAND flash memories 15 to 18, the seed selector 35 selects seed data from the seed table 31*b*, based on the seed number designated by the command. The seed data is supplied to the randomizing circuit 33 through the random number generating circuit 34. The randomizing circuit 33 randomizes the write data, based on the output data of the random number generating circuit 34. The output data of the randomizing circuit 33 is written in the memory cell array 31 through the data cache 32.

When data is written in the same block, that is, when new data is written in a block after data of the block is erased, the NAND controller 13 issues a command to select a seed number which is different from the previously selected seed number. Thereby, it is possible to prevent deterioration of the memory cells.

Figure 8:
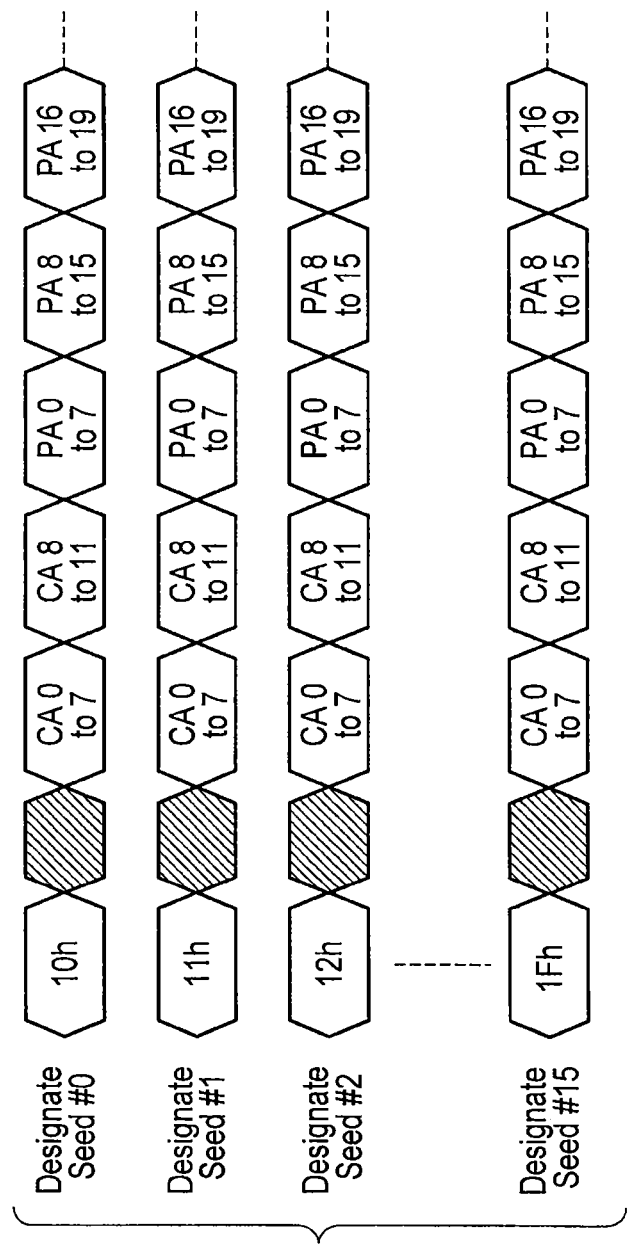
FIG. 8 is a diagram for explaining operation of the second embodiment, and illustrating an example of a command sequence in reading.

On the other hand, FIG. 8 illustrates an example of a command sequence in data reading.

The data read operation is to select the seed table which was used when the data was written in, and recover and output the data.

When a read request is issued from the host device 20, the controller 14 issues a read request to the NAND controller 13. The NAND controller 13 issues commands (10h, 11h, 12h-1Fh), each of which designates one of the seed numbers (Seed #0 to Seed #15), in response to the read request. The seed number which is designated in reading is the same as the seed number which has designated in writing.

For example, when the NAND flash memory 15 receives one of the above read commands (10h, 11h, 12h to 1Fh), the seed selector 35 selects the designated seed data from the seed table 31*b*. The selected seed data is supplied to the random number generating circuit 34 illustrated in FIG. 6. In the random number generating circuit 34, shuffling data is set as fixed data, in the same manner as writing. The random number data which is output from the random number generating circuit 34 is read from the memory cell array 31, and supplied to a recovering circuit 36 together with the read data held in the data cache 32. The recovering circuit 36 recovers the read data by the random number data. The output data of the recovering circuit 36 is transmitted to the host device 20 through the NAND controller 13, a buffer 12, and a host interface 11.

According to the second embodiment, a command to select seed data is added to the command sequence, and seed data is selected based on the command. Therefore, even when data which is to be written in is biased, it is possible to securely randomize the data, and improve the randomizing performance.

In addition, by improving the randomizing performance, it is possible to suppress occurrence of errors, and prevent deterioration of the memory cells.

Besides, the seed data is changed each time data of the same block is rewritten, and thereby it is possible to further prevent deterioration of the memory cells, and further improve reliability.

(Third Embodiment)

FIG. 9A to FIG. 9D illustrate a third embodiment.

In the first embodiment, the command sequence is provided with a command to designate shuffling data, and the seed data is shuffled in the random number generating circuit 34 based on the shuffling data serving as parameters.

In comparison with this, although the third embodiment is similar to the first embodiment in providing the command sequence with a command to designate parameters, the third embodiment has a structure in which the seed data is not shuffled in based on parameters, but the data cache 32 is controlled based on parameters.

As illustrated in FIG. 9A, for example, in the case of a four-level NAND flash memory, there are four threshold distributions. The four threshold distributions are set by data of a lower page (first page) and data of an upper page (second page). The four threshold distributions are randomized by using random number data generated from the same seed data, and thereafter rotated based on parameters, such that stress is equally applied to the memory cells. Specifically, data of the lower page or data of the upper page is inverted based on parameters.

More specifically, in the case where the parameters are the number of erases described above, when the number of erases is an odd number, data of the lower page is inverted as illustrated in FIG. 9B and FIG. 9D. When the number of erases is an even number, data of the upper page is inverted as illustrated in FIG. 9C. Performing this operation equalizes the stress which is applied to the memory cells.

The term "invert" means reversing the level of data or signals, for example, changing data "1" to "0", or changing data "0" to "1".

Figure 10:
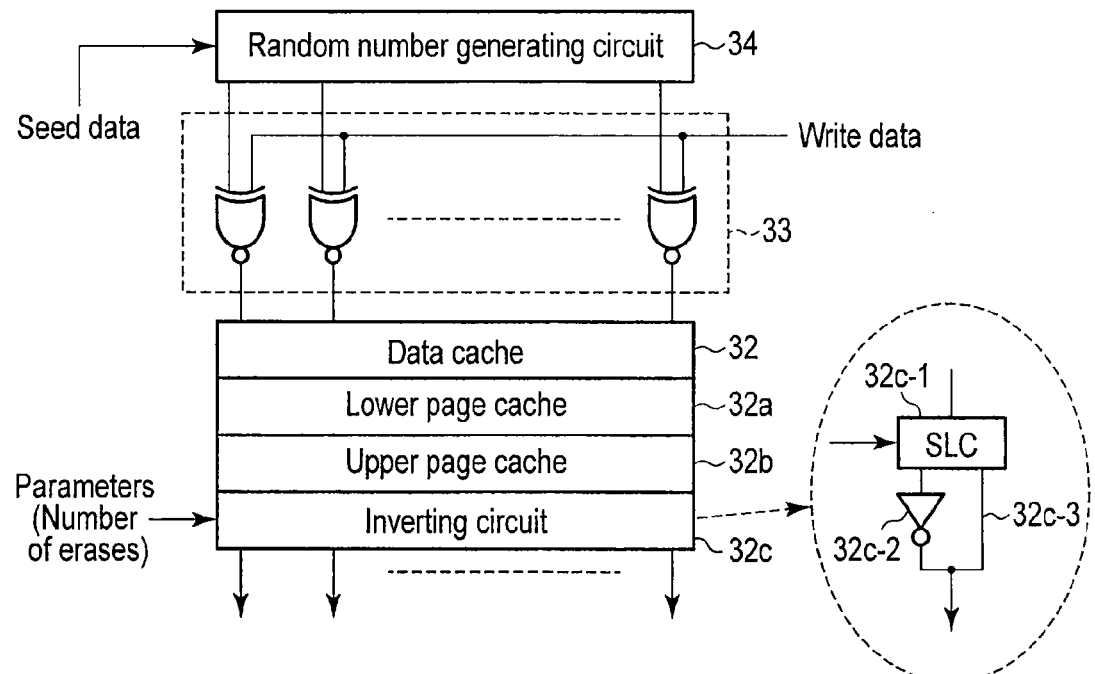
FIG. 10 is a diagram illustrating an example of a structure of a data cache applied to the third embodiment.

FIG. 10 illustrates an example of the data cache 32 which is applied to the third embodiment. The data cache 32 is, however, not limited to the structure.

The data cache 32 includes a lower page cache 32*a* which stores data of the lower page, an upper page cache 32*b* which stores data of the upper page, and an inverting circuit 32*c* which inverts the data of the lower page cache 32*a* and the data of the upper page cache 32*b*. It is premised that writing of the lower page and writing of the upper page are not performed simultaneously.

When the number of erases serving as parameters is an odd number, the inverting circuit 32*c* inverts data of the lower page stored in the lower page cache 32*a*, when the lower page is written. In addition, when the upper page is written, the inverting circuit 32c inverts data of the upper page stored in the upper page cache 32b.

The data of the lower page and the data of the upper page are successively supplied to the memory cell array 31, and written in the memory cells.

In the inverting circuit 32c, a selector 32c-1, an inverter circuit 32c-2, and an interconnect 32c-3 are arranged to cope with the data of each page. The selector 32c-1 includes an input end, and first and second output ends. The input end of the selector 32c-1 is connected to the lower page cache 32a when the lower page is written, and connected to the upper page cache 32b when the upper page is written. The first output end of the selector 32c-1 is connected with an input end of the inverter circuit 32c-2, and the second output end of the selector 32c-1 is connected with an end of the interconnect 32c-3. The other end of the interconnect 32c-3 is commonly connected to an output end of the inverter circuit 32c-2.

When the number of erases serving as parameters is an odd number, the input end of the selector 32c-1 is connected to the first output end. Therefore, data which is supplied from the lower page cache 32a or the upper page cache 32b is inverted and output. When the number of erases serving as parameters is an even number, the input end of the selector 32c-1 is connected to the second output end. Therefore, data which is supplied from the lower page cache 32a or the upper page cache 32b is output without any operation.

According to the above third embodiment, a command to control the data cache 32 is added to the command sequence, and the command parameters enables control to invert, or output without any operation, the data of the lower page and the data of the upper page. Therefore, stress which is applied to the memory cells is equalized, and it is possible to prevent deterioration of the memory cells.

The third embodiment shows the NAND flash memory which stores multiple-level data. The third embodiment is not limited to it, however, but is also applicable to, for example, a NAND flash memory which stores binary data.

In this case, data of the lower page or data of the upper page is not inverted based on the number of erases of the block to rotate the threshold voltage distributions, unlike the third embodiment, but data for each page is inverted based on the number of erases.

For example, when the number of erases is an odd number, data of pages of odd numbers are inverted to write data. When the number of erases is an even number, data of pages of even numbers are inverted to write data. When data is read, the inverted data is inverted and output.

According to the above structure, even when biased write data is input to a NAND flash memory which stores binary data, it is also possible to prevent deterioration of the memory cells and extend the life of the NAND flash memory.

(Fourth Embodiment)

In the above third embodiment, data is randomized in the data cache.

In comparison with this, the fourth embodiment has a structure in which a command to input seed data is added to the command sequence, seed data is directly input to NAND flash memories 15 to 18 from outside, and thereby random number data is generated.

Figure 11:
FIG. 11 is a diagram for explaining operation of a fourth embodiment, and illustrating an example of a command sequence in writing.

FIG. 11 illustrates a command sequence in writing by the NAND controller 13 according to the fourth embodiment.

In FIG. 11, a command (xxh) is a command to set seed data, and seed data (D0) (D1) . . . are input after issue of the command (xxh). Thereafter, a write command (80h) is issued. Then, column addresses and page addresses are successively input. The seed data (D0) (D1) . . . are set to values which equalize an average threshold level of each cell when the same block is repeatedly used.

When the NAND flash memories 15 to 18 receive the above command (xxh), the NAND flash memories 15 to 18 supply the following seed data (D0) (D1) . . . to, for example, the random number generating circuit 34 illustrated in FIG. 3. Shuffling data is fixed data as described above. The random number generating circuit 34 generates random number data in accordance with the seed data. The random number data which is generated by the random number generating circuit 34 is supplied to a randomizing circuit 33 together with the write data, and the write data is randomized by using the random number data. The randomized data is written in a memory cell array 31 through a data cache 32.

Figure 12:
FIG. 12 is a diagram for explaining operation of the fourth embodiment, and illustrating an example of a command sequence in reading.

On the other hand, when data is read from the memory cell array 31, a command of a sequence as illustrated in FIG. 12 is issued from the NAND controller 13.

Specifically, first, a command (xxh) to set seed data is issued, and thereafter seed data (D0) (D1) . . . are input. Thereafter, a read command (00h) is issued. Then, column addresses and page addresses are successively input.

The seed data which is the same in the data write sequence and the data read sequence is set by the command.

When data is read, the data which is read from the memory cells is recovered by the above operation by using the recovery circuit 36 illustrated in FIG. 6.

According to the fourth embodiment described above, seed data is input from outside of the NAND flash memories 15 to 18 by using a command, random number data is generated based on the seed data, and thereby the write data is randomized. The seed data is set to a value which equalizes an average threshold level of each cell, when the same block is repeatedly used. Therefore, even when biased write data is input, it is possible to securely randomize the write data, prevent deterioration of the memory cells, and extend the life of the NAND flash memory.

In the first to fourth embodiments described above, the number of erases is used as parameters for changing the seed data or controlling the cache. The parameters are not limited to it, however, but it is possible to use temperature information, cumulative sector value, time information, or logical addresses serving as management data, or use them in combination. Using the logical addresses is based on the premise that it is generally rare that the same logical block is repeatedly assigned to the same physical block, when wear leveling is properly performed in a state where there are sufficient room blocks.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile semiconductor storage device including a nonvolatile semiconductor memory;
a volatile memory in which a plurality of management data to manage writing in or reading from the nonvolatile semiconductor storage device is stored;
a controller that issues a first command to designate first management data stored in the volatile memory, and that issues a second command to designate writing in or reading from the nonvolatile semiconductor storage device; and a circuit, wherein the nonvolatile semiconductor storage device includes:

a first module that generates first random number data by shuffling first seed data based on the first management data designated by the first command, a second module that randomizes write data into first data based on the first random number data, the write data corresponding to the second command to designate writing in the nonvolatile semiconductor storage device, and a third module that recovers second data into read data using the first random number data, the second data being stored in the nonvolatile semiconductor memory, and the read data corresponding to the second command to designate read from the nonvolatile semiconductor device, the circuit inverts the data randomized by the second module for each page, based on the first command, the nonvolatile semiconductor memory is formed of a plurality of pages, to store a plurality of bits of data in one memory cell, the nonvolatile semiconductor memory includes at least a lower page and an upper page, the circuit inverts data of one of the lower page and the upper page, based on the second data, and the second data is number of erases, and the circuit inverts data of the lower page when the number of erases is an odd number, and inverts data of the upper page when the number of erases is an even number.

2. The memory system according to claim 1, wherein the controller issues the second command after the first command is issued.

3. The memory system according to claim 1, wherein the controller issues the first command after the second command is issued.

4. The memory system according to claim 1, wherein the second module includes an exclusive-OR gate which is supplied with the random number data and the write data, and the third module includes an exclusive-OR gate which is supplied with the random number and the read data.

5. The memory system according to claim 1, wherein the management data are one of number of erases the nonvolatile semiconductor storage device, number of reads from the nonvolatile semiconductor storage device, temperature information, time information, logical address, physical address, and cumulative sector value which indicates number of sectors.

6. A memory system comprising:

a first module;

a controller;

a second module that generates random number data based on first data that is stored in the first module and second data to manage writing or reading of data that is designated by a command from the controller, that randomizes write data based on the random number data, and that recovers read data based on the random number data; and a third circuit, wherein the command is sent from the controller to the first module, the second module includes:

a first circuit which generates the random number data, based on seed data serving as the first data and management data serving as the second data, and a second circuit which randomizes the write data or the read data based on the random number data generated by the first circuit, the first module is formed of a plurality of pages, to store a plurality of bits of data in one memory cell, the third circuit inverts the data randomized by the second circuit for each page, based on a first command, the first module includes at least a lower page and an upper page, the third circuit inverts data of one of the lower page and the upper page based on the second data, and the second data is number of erases, and the third circuit inverts data of the lower page when the number of erases is an odd number, and inverts data of the upper page when the number of erases is an even number.

7. The memory system according to claim 6, wherein the first data is seed data to generate the random number data.

8. The memory system according to claim 6, wherein the command is a command sequence that includes the first command to designate one of the first data, and a second command to command writing in or reading from the first module.

9. The memory system according to claim 8, wherein the controller issues the second command after the first command is issued.

10. The memory system according to claim 8, wherein the controller issues the first command after the second command is issued.

11. The memory system according to claim 6, wherein the first module includes a plurality of blocks which include the pages, and the first data is set to a value which equalizes an average threshold level of each memory cell, when a block of the first module is repeatedly used.

12. The memory system according to claim 1, wherein the first and second commands are part of a command sequence received by the nonvolatile semiconductor storage device.

13. The memory system according to claim 1, wherein the nonvolatile semiconductor memory includes a plurality of blocks which include the pages, and the first data is set to a value which equalizes an average threshold level of each memory cell, when a block of the nonvolatile semiconductor memory is repeatedly used.

14. The memory system according to claim 6, wherein the first command is part of a command sequence that also includes a second command, the command sequence being received by the nonvolatile semiconductor storage device.

* * * * *